United States Patent
Lee (12)

(10) Patent No.: US 6,255,689 B1
(45) Date of Patent: Jul. 3, 2001

(54) FLASH MEMORY STRUCTURE AND METHOD OF MANUFACTURE

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/467,251

(22) Filed: Dec. 20, 1999

(51) Int. Cl.$^7$ .................................................. H01L 29/72

(52) U.S. Cl. .......................... 257/314; 257/315; 257/316; 257/513; 438/201; 438/209; 438/212; 438/221; 438/230; 438/694

(58) Field of Search ..................................... 257/314, 315, 257/316, 513; 438/201, 221, 209, 212, 230, 694

(56) References Cited

U.S. PATENT DOCUMENTS 5,892,257 * 4/1999 Acocella et al. ..................... 257/316

* cited by examiner

Primary Examiner—Edward Wojciechowicz
(74) Attorney, Agent, or Firm—Jiawei Huang; J.C. Patents

(57) ABSTRACT

A flash memory cell structure and its method of manufacture. The flash memory cell has a vertical configuration. An opening and then a trench are formed in a substrate by etching. The trench (defined as the recessed section of the substrate) is used for forming a shallow trench isolation structure. The substrate region between two neighboring openings (defined as the protruding section of the substrate) is used for forming a common drain and a channel. A source terminal is formed in the substrate at the upper corner next to the shallow trench structure. A tunnel oxide layer is formed over the substrate surface of the opening. A floating gate and a dielectric layer are formed over the tunnel oxide layer. A control gate is formed inside the opening.

13 Claims, 4 Drawing Sheets

FLASH MEMORY STRUCTURE AND METHOD OF MANUFACTURE

BACKGROUND OF THE INVENTION

1. Field of the Invention

The present invention relates to a flash memory structure and its method of manufacture. More particularly, the present invention relates to a vertical type of flash memory structure.

2. Description of the Related Art

Flash memory generally consists of a floating gate for storing electric charges and a control gate for controlling data transfer. The floating gate is inserted between the control gate and a substrate. The floating gate is in a 'floating' state because the gate is not connected any external circuits. The control gate is connected to a word line while the drain terminal of each flash memory cell is connected to a bit line.

In a conventional flash memory, neighboring flash memory cells are electrically isolated from each other by field oxide (FOX). However, field oxide tends to occupy a lot of chip area. In addition, the source/drain terminals and the floating gate of each flash memory cell also occupy a lot of chip area. If area layout of source/drain terminals and floating gates of a flash memory are reduced without changing the devices' structures, performance of the memory device will be affected.

Although shallow trench isolation can replace conventional field oxide as an electrical insulator between neighboring flash memory cells so that the level of integration is increased, area occupation of STI is still limited by photoresist resolution.

SUMMARY OF THE INVENTION

The invention provides a method of manufacturing flash memory. A substrate having a patterned mask layer thereon is provided. Using the patterned mask layer as an etching mask, the substrate is etched to form a plurality of openings in the substrate. A first liner oxide layer is formed over the exposed substrate inside the openings. Spacers are formed on the sidewalls of the openings. Each spacer has a first width at the bottom. Using the mask layer and spacers as an etching mask, the exposed substrate at the bottom of each opening is further etched to form a trench. An insulation layer is formed inside the trench, thereby forming a shallow trench isolation structure. A portion of the spacers is removed so that its first width at the bottom is reduced to a second width. The patterned mask layer is removed. A first doped region is formed in the substrate just outside the top corner region of the insulation layer, and a second doped region is formed in the substrate just underneath the former mask layer. The first doped region later functions as a source terminal while the second doped region later functions as a drain region. The spacers are removed and then a stop layer is selectively formed over the second doped regions. A tunnel oxide layer is formed on the substrate surface between the first doped region and the second doped region. Conductive spacers are next formed on the substrate sidewalls between the first doped region and the second doped region. A first dielectric layer is formed over the conductive spacers. Conductive material is deposited into the opening to form a conductive layer. The conductive layer, the first dielectric layer and the conductive spacers are subsequently patterned to form a plurality of control gates, a plurality of second dielectric layers and a plurality of floating gates.

In addition, before or after the formation of the first doped regions and the second doped regions, an additional third doped region in the substrate below the second doped region on one side of the first doped region and a fourth doped region in the substrate just under the shallow trench isolation structure may be formed. The third doped region serves as an anti-punch through implant while the fourth doped region serves as a field implant. Furthermore, polarity of the ions implanted into the substrate to form the first and the second doped region is opposite to the ions implanted into the substrate to form the third and the fourth doped region.

The invention also provides a flash memory structure. The structure includes a substrate having a protruding section and a recessed section, in which the protruding section has a sidewall and a substrate surface is located between the two sections. A tunnel oxide layer is formed on the sidewall of the protruding section and on the substrate surface between the two sections. A common drain terminal is formed at the top end of the protruding section. A source terminal is formed in the substrate region between the protruding and the recessed sections. A floating gate is formed above the tunnel oxide layer and between the source and drain terminal and a dielectric layer is formed above the floating gate. A shallow trench isolation structure is formed in the recessed section and a control gate is formed between the dielectric layer and the shallow trench isolation structure.

Accordingly, the present invention provides a method of manufacturing flash memory cells capable of increasing the level of integration. In addition, the invention also provides a method of manufacturing flash memory cells that utilizes current fabricating techniques for reducing the dimensions of isolating structures and flash memory cells. Furthermore, the invention provides a vertical type of flash memory structure capable of reducing area occupation of each flash memory cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
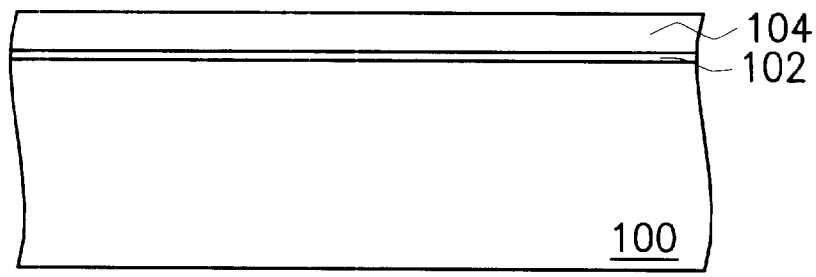
FIGS. 1A through 1G are schematic cross-sectional views showing the progression of steps for manufacturing a flash memory according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the progression of steps for manufacturing a flash memory according to one preferred embodiment of the invention.

As shown in FIG. 1A, a substrate 100 such as a semiconductor silicon substrate is provided. A pad oxide layer 102 and a mask layer 104 are formed over the substrate 100. The pad oxide layer 102 can be formed by, for example, thermal oxidation. The mask layer 104 can be a silicon nitride layer formed by, for example, chemical vapor deposition.

Figure 1B:
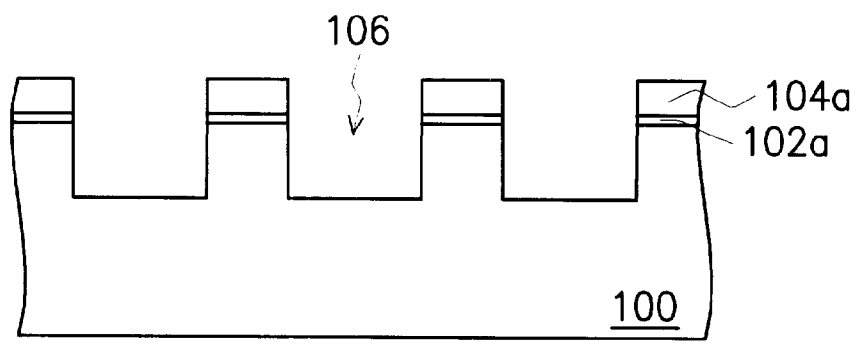

As shown in FIG. 1B, the mask layer 104 is patterned to form a patterned mask layer 104a. Using the patterned mask layer 104a as an etching mask, the pad oxide layer 102 and the substrate are sequentially etched. The pad oxide layer 102 becomes a pad oxide layer 102a and openings 106 are formed in the substrate 100 so that areas for forming the desired vertical memory units are defined. Regions surrounding the openings 106 become the protruding sections of the substrate 100. The protruding sections are subsequently turned into drain terminals and channel regions. Depth of the openings 106 depends on the desired channel length and junction depth of the drain terminal.

Figure 1C:
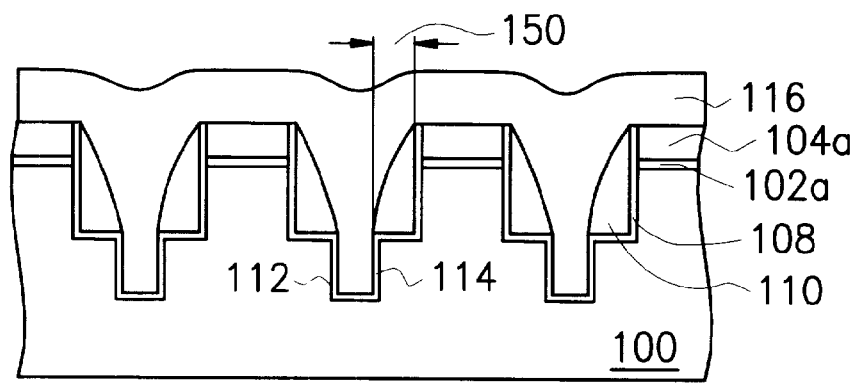

As shown in FIG. 1C, a liner oxide layer 108 is formed over the exposed substrate inside the openings 106. Spacers 110 are formed on the sidewalls of the openings 106. The spacers 110 are preferably formed using silicon nitride and have a base width 150.

Steps for forming shallow trench isolation structures are next carried out. Using the patterned mask layer 104a and the spacers 110 as an etching mask, a portion of the substrate 100 at the bottom of each opening 106 is removed to form a trench 112. The trenches 112 become the recessed sections of the substrate 100. Since width of the trench 112 is largely controlled by the dimensions of the spacers 110, size of the trench 112 is not limited by the resolution of photoresist in a photolithographic operation. Therefore, this invention is capable of reducing area occupation of subsequently formed shallow trench isolation inside the trench 112. A liner oxide layer 114 is formed over the substrate surface within the trench 112. The liner oxide layer 108 and the liner oxide layer 114 join near the upper corners of the trenches 112 to form a continuous liner oxide layer. The liner oxide layer 114 can be formed by, for example, thermal oxidation. Insulating material is next deposited into the openings 106 and the trenches 112 to form an insulation layer 116. The insulation layer 116 is preferably a silicon oxide layer formed by, for example, chemical vapor deposition.

Figure 1D:
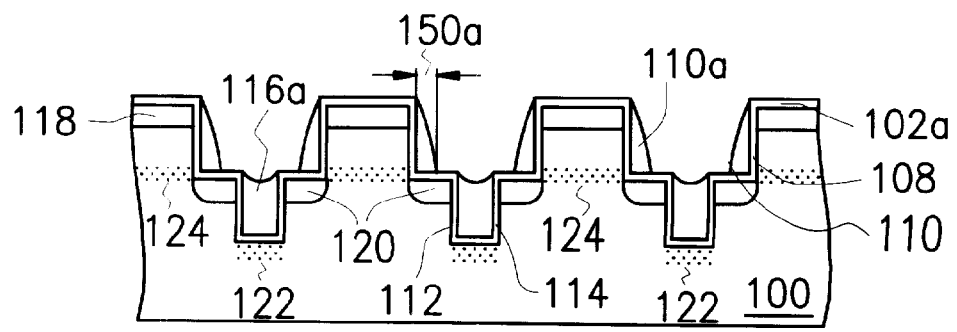

As shown in FIG. 1D, the insulation layer 116 is etched back to form an insulation layer 116a inside each trench 112. The insulation layers 116a are densified to enhance electrical insulation. The densified insulation layer 116a and the liner oxide layer 114 together form a shallow trench isolation structure. A portion of the material on the spacers 110 is removed so that smaller spacers 110a are obtained. The spacers 110a have a base width 150a. Dimensions of the spacers 110 can be reduced by, for example, performing an etching operation. Meanwhile, the patterned mask layer 104a above the pad oxide layer 102a is also removed.

Still referring to FIG. 1D, a two-stage ion implantation is carried out. Using the spacers 110a and the insulation layer 116a as an ion implant mask, a first ion implantation is carried out. Hence, doped regions 118 are formed in the substrate 100 underneath the pad oxide layer 102a (the top end of protruding sections) and doped regions 120 are formed in the substrate 100 next to the top end of the insulation layers 116a (the region between the protruding section and the recessed section). The doped regions 118 later function as drain terminals while the doped regions 120 later function as source terminals. In fact, the source terminals are buried source lines and the drain terminals are buried common drain lines. N-type or P-type ions can be implanted into the substrate 100 to form the doped regions 118 and 120 depending on whether N-type or P-type flash memory cells are required. In general, the first ion implantation is carried out using a dosage of about $101^{15}$ atoms/cm$^2$ and at an energy level of about 40 to 60 KeV. In the second ion implantation, ions having a polarity opposite to the implanted ions in the first ion implantation are used. The second ion implantation forms doped regions 122 in the substrate 100 underneath the insulation layers 116a and doped regions 124 in the substrate 100 underneath the pad oxide layer 102a and next to the doped regions 120. The doped region 122 serves as a field implant for the shallow trench isolation structure while the doped region 124 serves as an anti-punch through implant for neighboring source terminals. The second ion implantation can be carried out using a dosage of about $10^{12}$ atoms/cm$^2$. Note that the order in which the first and the second ion implantations are carried out can be reversed.

Figure 1E:
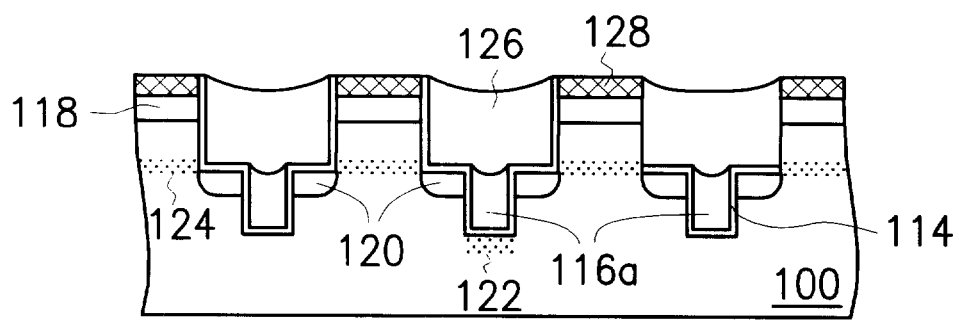

As shown in FIG. 1E, the spacers 110a are removed and then a filler layer 126 is formed inside each opening 106. The filler layer 126 is preferably a silicon oxide formed by, for example, depositing silicon oxide onto the substrate 100 in a chemical vapor deposition. The silicon oxide layer is then etched back until the pad oxide is also removed to expose the doped regions 118 below. A stop layer 128 is formed over the doped regions 118. The stop layer 128 is preferably a silicon oxynitride layer formed by, for example, performing a nitridation with minor amount of oxygen in the surrounding atmosphere. Nitridation only occurs on the surface of the substrate 100 within the doped regions 118. During nitridation, substrate sidewalls just under the doped regions 118 are protected by the filler layers 126.

Figure 1F:
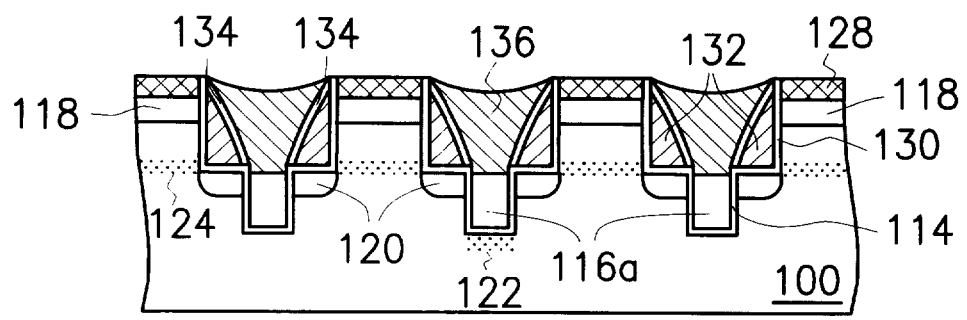

As shown in FIG. 1F, the filler layers 126 are removed to expose the doped regions 118 and the substrate sidewalls below the doped regions 118. A tunnel oxide layer 130 is formed on the exposed substrate sidewalls. The tunnel oxide layer 130 extends to reach the liner oxide layer 114 at the upper corner of the insulation layer 116a. The tunnel oxide layer 130 can be formed by, for example, thermal oxidation.

Conductive spacers 132 are formed on the substrate sidewalls between the drain region 118 and the source region 120. The conductive spacers 132 can be doped polysilicon layers formed, for example, by depositing doped polysilicon to form a conformal doped polysilicon layer and then anisotropically etching the doped polysilicon layer using the stop layer 128 as an etching stop. The conductive spacer 132 later serves as the floating gate of a flash memory cell.

Figure 2:
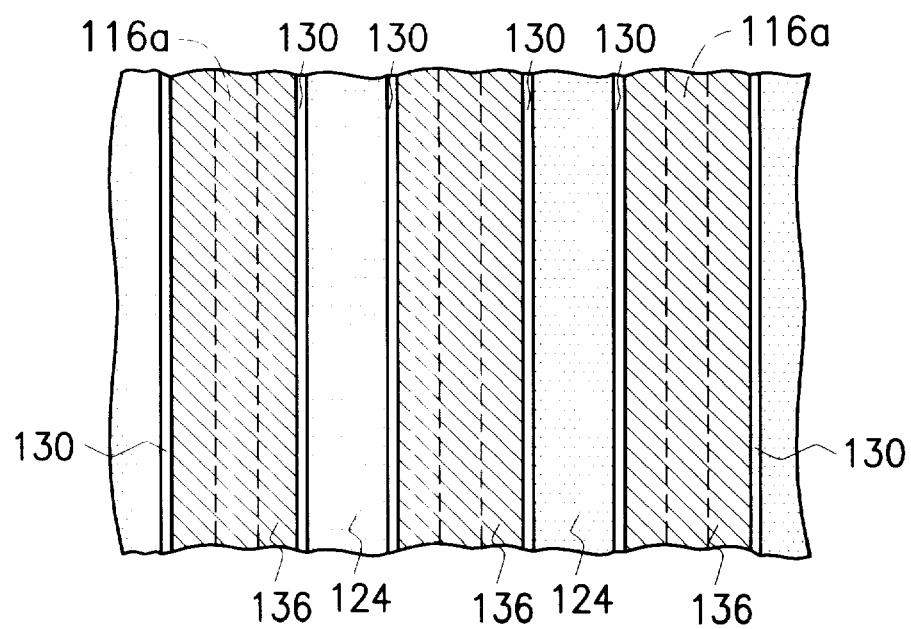
FIG. 2 is a top view of FIG. 1F.

A dielectric layer 134 is formed over the exposed conductive spacers 132. The dielectric layer 134 can be an oxide layer formed by, for example, thermal oxidation. Alternatively, the dielectric layer 134 can be an oxide/nitride/oxide composite layer. Conductive material is deposited into the openings 106 to form conductive layers 136. The conductive layers 136 can be doped polysilicon layers formed by, for example, depositing doped polysilicon onto the substrate 100 and then etching back the doped polysilicon layer so that discontinuous conductive layers 136 are formed. FIG. 2 is a top view of FIG. 1F. The conductive layers 136 subsequently serve as the control gates of the flash memory cells.

Figure 1G:
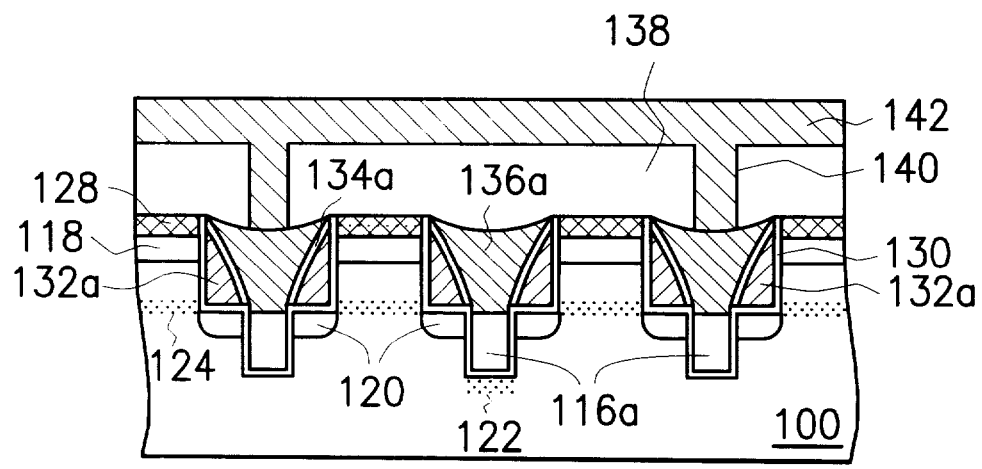
Figure 3:
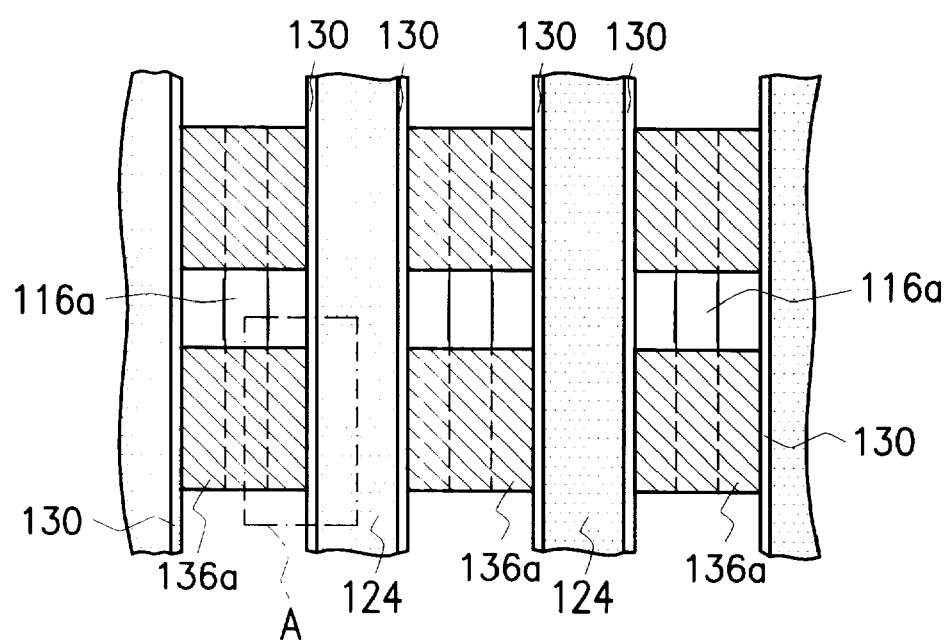
FIG. 3 is a top view of FIG. 1G showing the landing pads of word lines.

As shown in FIG. 1G, the conductive layers 136 are patterned to form conductive layers 136a (please also refer to FIG. 3). Meanwhile, the dielectric layers 134 and the conductive spacers 132F are patterned into dielectric layers 134a and conductive spacers 132a, respectively. The conductive layers 136a become the landing pads of word lines as well as the control gates of the flash memory cells. The conductive spacers 132a become the floating gates of the flash memory cells. FIG. 3 is a top view of FIG. 1G showing the landing pads of word lines.

Figure 4:
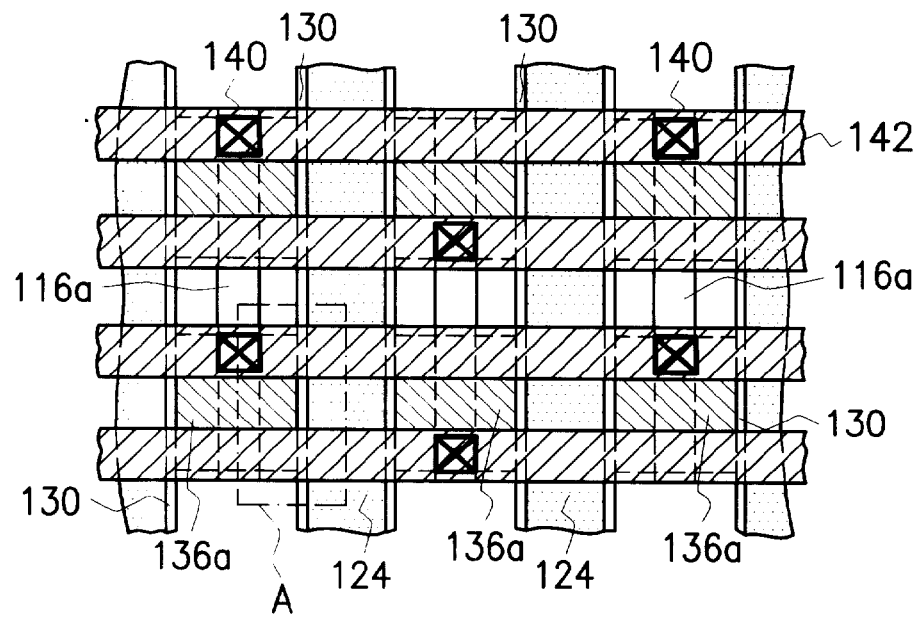
FIG. 4 is a top view of FIG. 1G.

An insulation layer 138 is formed over the substrate 100, and then word lines 142 are formed over the insulation layer 138. The word lines 142 are electrically connected to various conductive layers 136a through contacts 140 in the insulation layer 138. The insulation layer 138 can be a silicon oxide layer and the word lines 142 can be made from material such as aluminum, aluminum-copper alloy or copper. The word lines 142 are formed in a direction roughly perpendicular to the doped regions 118 and 120. Since the doped regions 118 are common drain terminals of neighboring flash memory cells, neighboring flash memory cells that are parallel to the word lines 142 are connected to different word lines 142 to prevent electrical interference. FIG. 4 is a top view of FIG. 1G.

Figure 5:
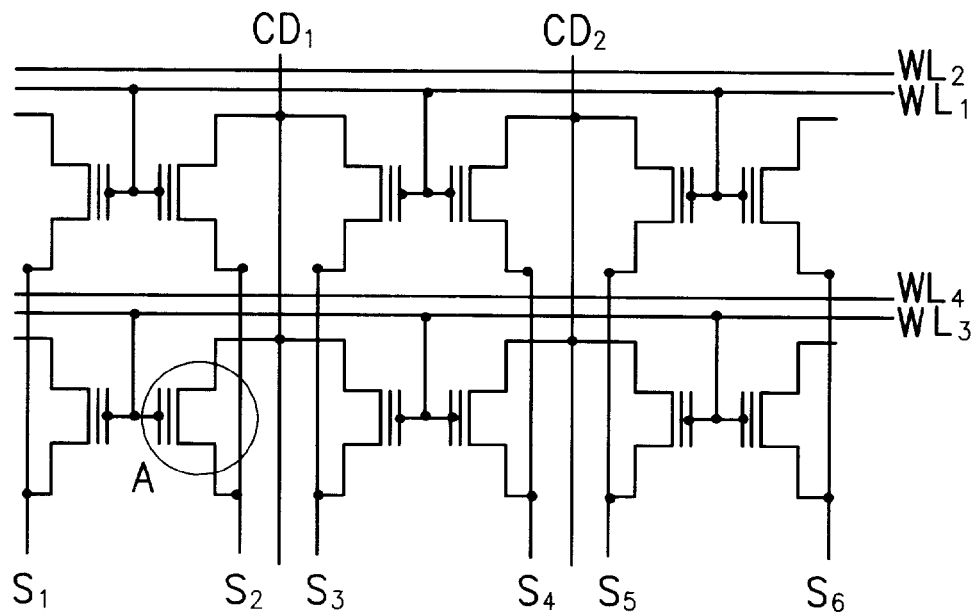
FIG. 5 is an equivalent circuit diagram of a portion of the flash memory according to the invention.

FIG. 5 is an equivalent circuit diagram of a portion of the flash memory according to the invention. The mode of operation of a flash memory can be roughly divided into two major types. One type relies on FN tunneling to carry out memory erase while hot electron injection is used to carry out program coding. A second type similarly relies on FN tunneling to carry out memory erase, but FN tunneling is also sed to carry out program coding.

To carry out an erase operation in the first mode, for example, positive voltages are applied to various source lines $S_1, S_2, S_3, S_4, S_5, S_6$, the common drain lines $CD_1, CD_2$ and the substrate, while negative voltages are applied to various word lines $WL_1, WL_2, WL_3, WL_4$, respectively, so that electrons are pulled out from the floating gates through a FN tunneling mechanism. Consequently, data within the flash memory cells are globally removed. When a particular flash memory cell such as A is selected for coding, a 0V is applied to the common drain line CD, and a positive voltage such as Vcc is applied to the source line $S_2$. In addition, a positive voltage higher than the source line $S_2$ such as 2Vcc is applied to the word line WL3. The non-selected source lines such as $S_1, S_3, S_4, S_5, S_6$ and the common drain line $CD_2$ are all set to 0V. Similarly, the non-selected word lines $WL_1, WL_2$ and $WL_4$ are all set to either 0V or a negative voltage. Consequently, hot electrons are injected into the floating gate of flash memory cell A so that the flash memory cell A is coded.

To carry out an erase operation in the second mode, for example, zero voltage is applied to various source lines $S_1, S_2, S_3, S_4, S_5, S_6$, the common drain lines $CD_1, CD_2$ and the substrate, and positive voltages are applied to various word lines $WL_1, WL_2, WL_3, WL_4$ so that electrons are injected into the floating gates through a FN tunneling mechanism. Consequently, data within the flash memory cells are globally removed. When a particular flash memory cell such as A is selected for coding, a high voltage such as Vcc is applied to the common drain line $CD_1$, and the source line $S_2$. In addition, a negative voltage is applied to the word line $WL_3$. The non-selected source lines such as $S_1, S_3, S_4, S_5, S_6$, the non-selected common drain line $CD_2$ and the non-selected word lines $WL_1, WL_2, WL_4$ are all set to 0V. Consequently, electrons are pulled from the floating gate of flash memory cell A so that the flash memory cell A is coded.

In summary, the advantages of this invention include:

1. The dimensions of isolating structure and each flash memory cell are reduced using current fabricating techniques, only.

2. Each flash memory cell has a vertical configuration so that area of occupation for each device is greatly reduced.

3. Manufacturing steps are simple to carry out and self-aligned processes are frequently used so that the number of photomask required is reduced. Hence, production cost can be lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a flash memory, comprising the steps of:

providing a substrate having a patterned mask layer thereon;

transferring a pattern of the patterned mask layer to the substrate so that an opening is formed in the substrate;

forming a first liner oxide layer over an exposed substrate inside the opening;

forming spacers on sidewalls of the opening, wherein the each spacer has a first base width;

forming a trench in the substrate at a bottom of the opening while using the patterned mask layer and the spacers as a hard mask;

forming an insulation layer in the trench to form a shallow trench isolation structure;

reducing the first base width of the spacers to a second base width;

removing the patterned mask layer;

forming a first doped region in the substrate next to an upper corner of the insulation layer and a second doped region in the substrate under the patterned mask layer, wherein the first doped region serves as a source terminal and the second doped region serves as a drain terminal;

removing the spacers;

forming an etching stop layer over the second doped region;

forming a tunnel oxide layer over the substrate between the first and the second doped region;

forming conductive spacers over the tunnel oxide coated sidewalls between the first and the second doped region;

forming a first dielectric layer over the conductive spacers; forming a conductive layer inside the opening above the first dielectric layer; and patterning the conductive layer, the first dielectric layer and the conductive spacers to form a plurality of control gates, a plurality of second dielectric layers and a plurality of floating gates, respectively.

2. The method of claim 1, wherein the step of forming the spacers includes depositing silicon nitride.

3. The method of claim 1, wherein after the step of forming the first and the second doped region, further includes forming a third doped region in the substrate under the second doped region next to the first doped region and a fourth doped region in the substrate under the shallow trench isolation structure.

4. The method of claim 3, wherein ions used for forming the first and the second doped region have a polarity opposite to the ions used for forming the third and the fourth doped region.

5. The method of claim 1, wherein before the step of forming the first and the second doped region, further includes forming a third doped region in the substrate under the second doped region next to the first doped region and a fourth doped region in the substrate under the shallow trench isolation structure.

6. The method of claim 5, wherein ions used for forming the first and the second ped region have a polarity opposite to that of the ions used for forming the third and the fourth doped region.

7. The method of claim 1, wherein the step of forming the conductive spacers includes depositing doped polysilicon.

8. The method of claim 1, wherein the step of forming the conductive layer includes depositing doped polysilicon.

9. The method of claim 1, wherein the step of forming the first dielectric layer includes depositing silicon oxide.

10. A flash memory cell structure, comprising:

a substrate having a protruding section and a recessed section, wherein the protruding section has a sidewall and there is a substrate surface between the protruding section and the recessed section;

a tunnel oxide layer over the substrate surface between the protruding section and the recessed section;

a common drain terminal at a top end of the protruding section;

a source terminal located in the substrate between the protruding section and the recessed section;

a floating gate above the tunnel oxide and between the source terminal and the drain terminal;

a dielectric layer above the floating gate;

a shallow trench isolation structure in the recessed section; and a control gate between the dielectric layer and the shallow trench isolation structure.

11. The structure of claim 10, wherein a material for forming the floating gate includes doped polysilicon.

12. The structure of claim 10, wherein a material for forming the control gate includes doped polysilicon.

13. The structure of claim 10, wherein a material for forming the first dielectric layer includes silicon oxide.

* * * * *